(12) United States Patent
Han et al.

(10) Patent No.: US 12,401,343 B2
(45) Date of Patent: Aug. 26, 2025

(54) ACOUSTIC RESONATOR

(71) Applicant: SAMSUNG ELECTRO-MECHANICS CO., LTD., Suwon-si (KR)

(72) Inventors: Sang Heon Han, Suwon-si (KR); Won Han, Suwon-si (KR); Tae Hun Lee, Suwon-si (KR); Chang Hyun Lim, Suwon-si (KR); Ran Hee Shin, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 861 days.

(21) Appl. No.: 17/579,944

(22) Filed: Jan. 20, 2022

(65) Prior Publication Data

US 2023/0022838 A1 Jan. 26, 2023

(30) Foreign Application Priority Data

Jul. 20, 2021 (KR) .................. 10-2021-0095012

(51) Int. Cl.
*H03H 9/17* (2006.01)
*H03H 9/02* (2006.01)
*H03H 9/13* (2006.01)

(52) U.S. Cl.
CPC .......... *H03H 9/17* (2013.01); *H03H 9/02007* (2013.01); *H03H 9/13* (2013.01)

(58) Field of Classification Search
CPC ............................ H03H 9/17; H03H 9/02007
See application file for complete search history.

(56) References Cited

U.S. PATENT DOCUMENTS

| | | | |
|---|---|---|---|
| 9,065,421 B2 | 6/2015 | Feng et al. | |
| 10,727,809 B2 | 7/2020 | Sadhu et al. | |
| 11,114,997 B2 | 9/2021 | Shin et al. | |
| 2013/0033151 A1 | 2/2013 | Ueda et al. | |
| 2015/0171826 A1 | 6/2015 | Sakashita et al. | |
| 2015/0381144 A1 | 12/2015 | Bradley et al. | |
| 2016/0142038 A1* | 5/2016 | Taniguchi | H03H 9/564 333/133 |

(Continued)

FOREIGN PATENT DOCUMENTS

| | | |
|---|---|---|
| JP | 2013-34130 A | 2/2013 |
| JP | 2015-119249 A | 6/2015 |

(Continued)

OTHER PUBLICATIONS

Taiwanese Office Action issued on Feb. 13, 2023, in counterpart Taiwanese Patent Application No. 111102861 (5 pages in English, 5 pages in Chinese).

(Continued)

*Primary Examiner* — Bryan P Gordon
(74) *Attorney, Agent, or Firm* — NSIP Law

(57) ABSTRACT

An acoustic resonator includes a substrate and a resonant portion. The resonant portion has a central portion in which a first electrode, a first piezoelectric layer, a second piezoelectric layer, and a second electrode are stacked in order on the substrate, and an extension portion extending outwardly from the central portion and including an insertion layer. A ratio of an average thickness of the first piezoelectric layer to an average thickness of the second piezoelectric layer is 18.4% to 40%.

10 Claims, 10 Drawing Sheets

(56) References Cited

U.S. PATENT DOCUMENTS

| | | | |
|---|---|---|---|
| 2017/0285695 A1 | 10/2017 | Nair et al. | |
| 2018/0254764 A1 | 9/2018 | Lee et al. | |
| 2019/0245509 A1* | 8/2019 | Hurwitz | H03H 9/02031 |
| 2020/0195220 A1* | 6/2020 | Han | H10N 30/877 |
| 2020/0204148 A1* | 6/2020 | Kim | H03H 9/02118 |
| 2020/0252046 A1* | 8/2020 | Shin | H03H 9/54 |
| 2021/0075396 A1 | 3/2021 | Lim et al. | |
| 2021/0075398 A1 | 3/2021 | Lee et al. | |

FOREIGN PATENT DOCUMENTS

| | | |
|---|---|---|
| JP | 2016-96466 A | 5/2016 |
| KR | 10-2018-0101129 A | 9/2018 |
| KR | 10-2019-0084008 A | 7/2019 |
| KR | 10-2020-0094995 A | 8/2020 |
| TW | 201810939 A | 3/2018 |
| TW | 202112066 A | 3/2021 |

OTHER PUBLICATIONS

Korean Office Action issued on Mar. 24, 2025, in counterpart Korean Patent Application No. 10-2021-0095012 (5 pages in English, 4 pages in Korean).

\* cited by examiner

ACOUSTIC RESONATOR

CROSS-REFERENCE TO RELATED APPLICATIONS

This application claims the benefit under 35 USC 119(a) of Korean Patent Application No. 10-2021-0095012 filed on Jul. 20, 2021, in the Korean Intellectual Property Office, the entire disclosure of which is incorporated herein by reference for all purposes.

BACKGROUND

1. Field

The present disclosure relates to an acoustic resonator.

2. Description of Related Art

In accordance with the trend of miniaturization of wireless communications devices, miniaturization of high-frequency components has been increasingly necessary, and a bulk acoustic wave (BAW) type filter using the technique of manufacturing a semiconductor thin film wafer may be an example of the trend.

A bulk acoustic resonator (BAW) may be a thin film device configured as a filter, which may generate resonance using piezoelectric properties by depositing a piezoelectric dielectric material on a silicon wafer, a semiconductor substrate. The $kt^2$ value of such a bulk acoustic resonator (BAW) may affect a bandwidth, insertion loss, and return loss properties of a bulk acoustic resonator (BAW) filter, and as a method of controlling the $kt^2$ value, a method of doping a piezoelectric body with a relevant material has been generally used.

However, when the method is used, costs may increase, and the Q value may decrease such that performance may deteriorate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes a substrate and a resonant portion. The resonant portion has a central portion in which a first electrode, a first piezoelectric layer, a second piezoelectric layer, and a second electrode are stacked in order on the substrate, and an extension portion extending outwardly from the central portion and including an insertion layer. A ratio of an average thickness of the first piezoelectric layer to an average thickness of the second piezoelectric layer is 18.4% to 40%.

A piezoelectric coefficient of the first piezoelectric layer may be different from a piezoelectric coefficient of the second piezoelectric layer.

FIGS. 11A and 11B are graphs illustrating Qp values and $kt^2$ values of an acoustic resonator according to a comparative example and an embodiment of the present disclosure.

The insertion layer may include an inclined surface extending away from the central portion.

The insertion layer may be disposed between the first piezoelectric layer and the first electrode.

The insertion layer may be disposed above the second electrode.

The insertion layer may be disposed between the second piezoelectric layer and the second electrode.

The insertion layer may be disposed below the first electrode.

A portion of the second electrode may be disposed in the extension portion.

The acoustic resonator may further include a bent portion disposed in the extension portion and extending obliquely from the central portion along a shape of the insertion layer. The bent portion may include an inclined portion disposed on an inclined surface of the insertion layer.

The insertion layer may be formed of a material different from a material of the first and second piezoelectric layers.

The insertion layer may include a dielectric material.

In another general aspect, an acoustic resonator includes a substrate and a resonant portion. The resonant portion has a central portion in which a first electrode, a first piezoelectric layer, a second piezoelectric layer, and a second electrode are stacked in order on the substrate, and an extension portion extending outwardly from the central portion and including an insertion layer. A piezoelectric coefficient of the first piezoelectric layer is different from a piezoelectric coefficient of the second piezoelectric layer, and a root mean square (RMS) of a roughness of an interfacial surface between the first piezoelectric layer and the second piezoelectric layer is 2 nm or less.

A ratio of an average thickness of the first piezoelectric layer to an average thickness of the second piezoelectric layer may be 18.4% to 40%.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
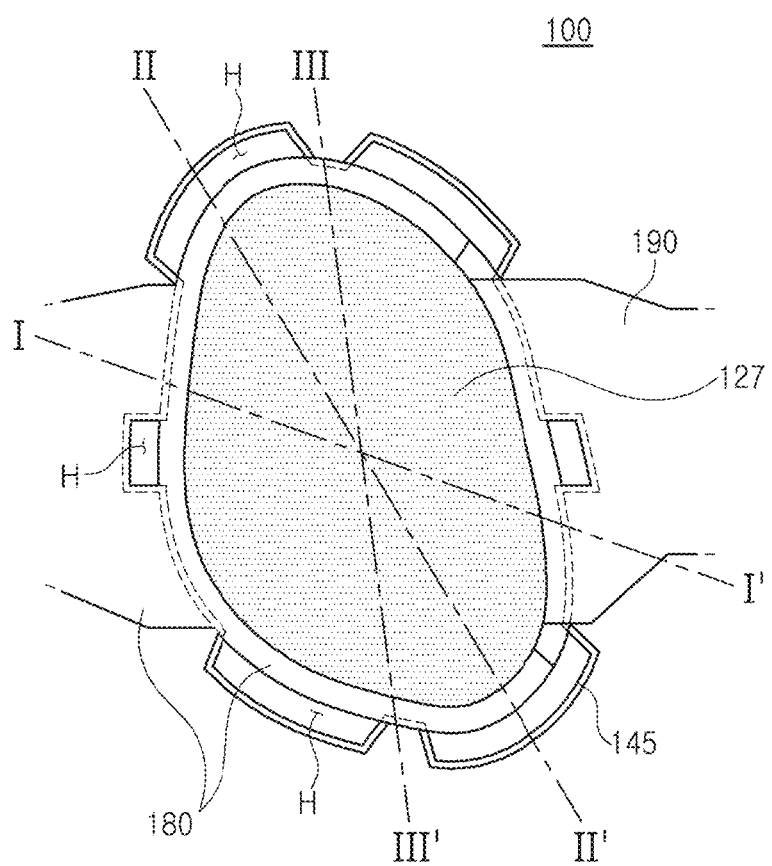
FIG. 1 is a plan diagram illustrating an example of an acoustic resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
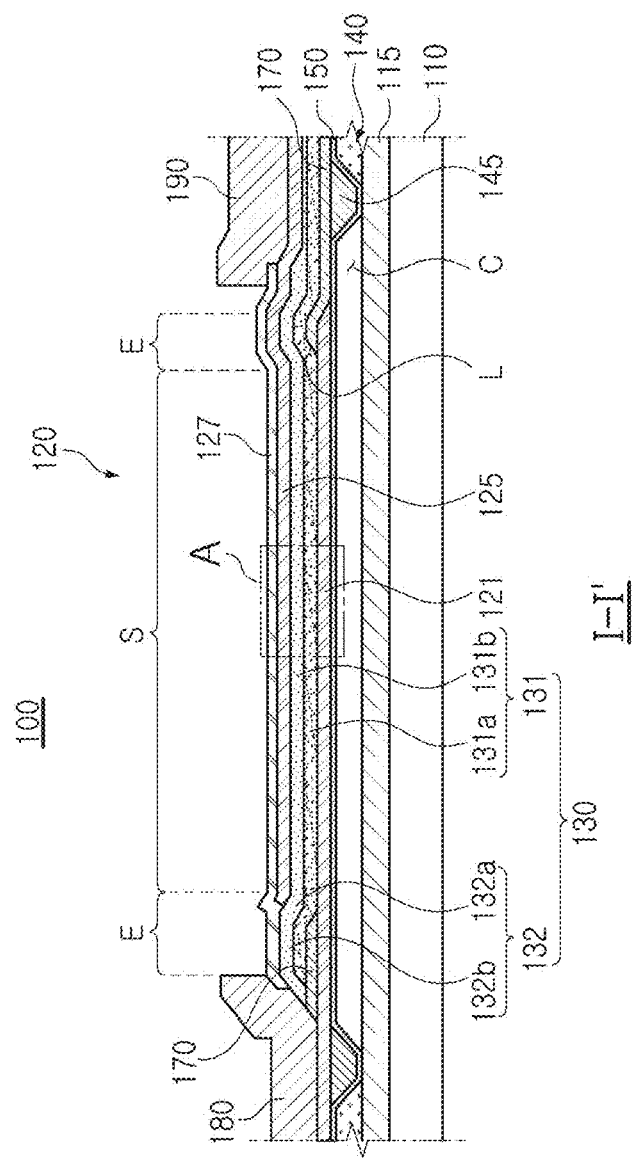
FIG. 2 is a cross-sectional diagram taken along line I-I' in FIG. 1.
Figure 3:
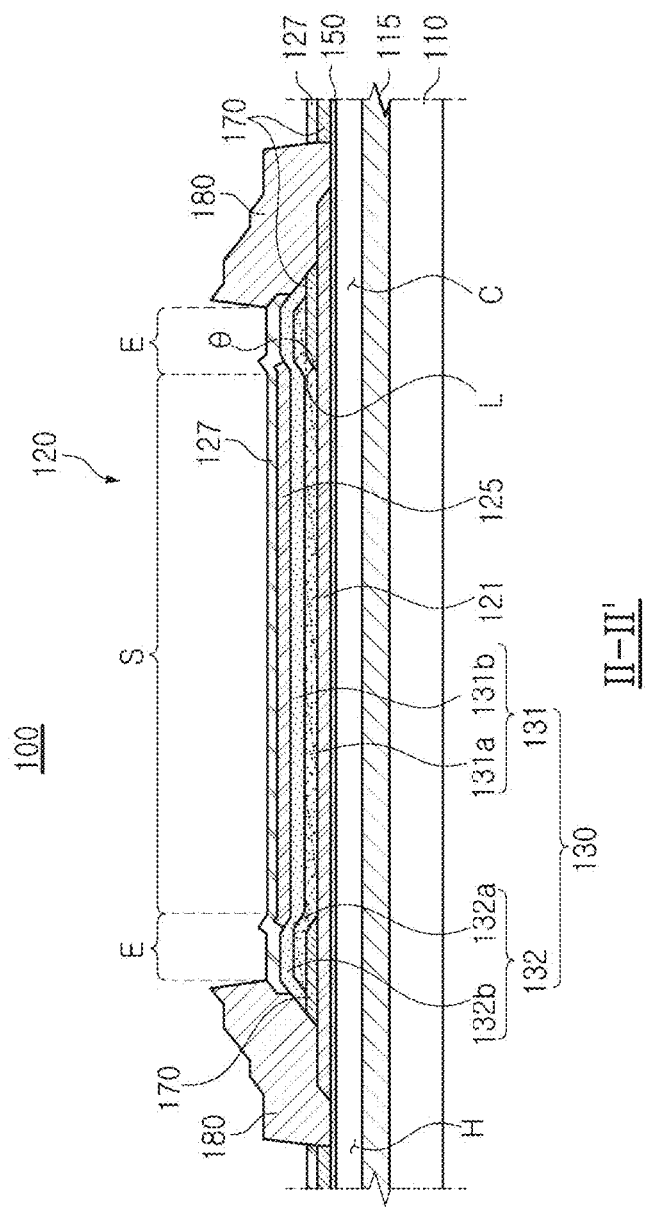
FIG. 3 is a cross-sectional diagram taken along line II-II' in FIG. 1.
Figure 4:
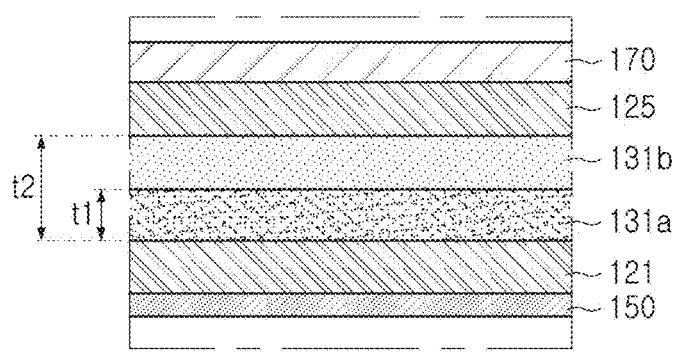
FIG. 4 is an enlarged diagram illustrating region A in FIG. 2.
Figure 5:
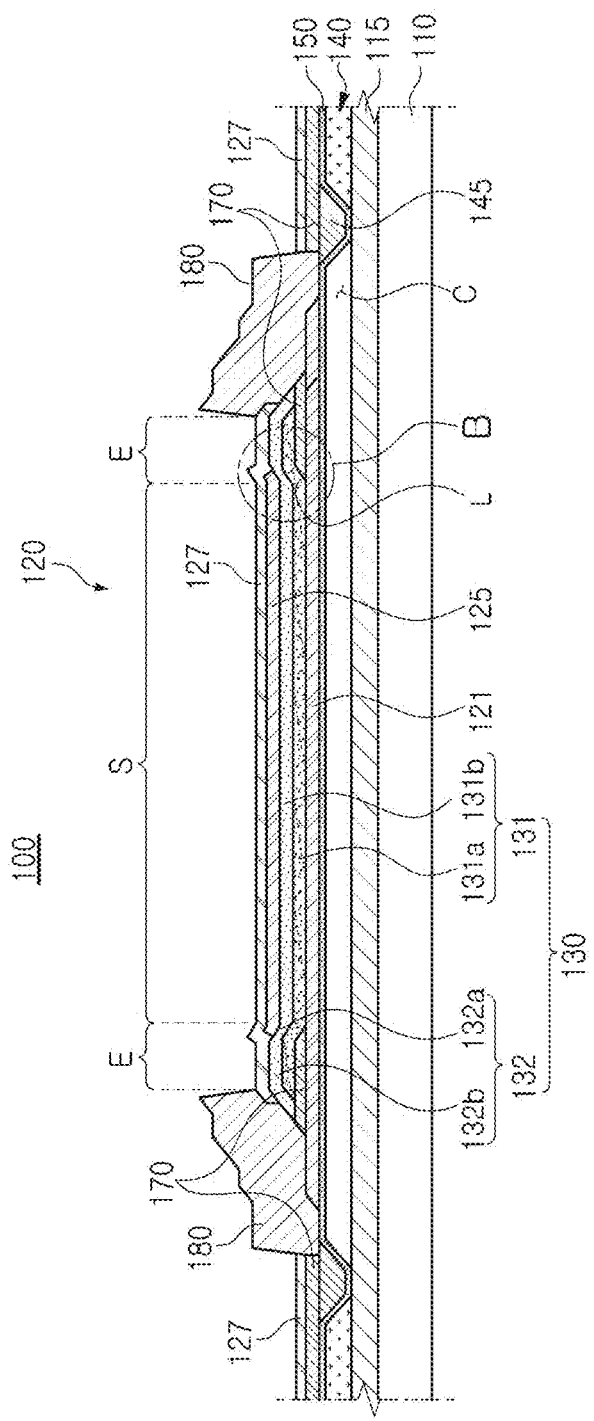
FIG. 5 is a cross-sectional diagram taken along line III-III' in FIG. 1.

FIG. 1 is a plan diagram illustrating an example of an acoustic resonator. FIG. 2 is a cross-sectional diagram taken along line I-I' in FIG. 1. FIG. 3 is a cross-sectional diagram taken along line II-II' in FIG. 1. FIG. 4 is an enlarged diagram illustrating region A in FIG. 2. FIG. 5 is a cross-sectional diagram taken along line III-III' in FIG. 1.

Referring to FIGS. 1 to 5, an acoustic resonator 100 in the example embodiment may be configured as a bulk acoustic wave resonator (BAW), and may include a substrate 110, a resonant portion 120 including a central portion S in which a first electrode 121, a first piezoelectric layer 131a, a second piezoelectric layer 131b, and a second electrode 125 are stacked in order on the substrate, and an expansion portion E extending outwardly from the central portion S.

In this case, when an average thickness of the first piezoelectric layer 131a is defined as t1 and an average thickness of the second piezoelectric layer 131b is defined as t2, t1/t2 may be within the range of 18.4% or more and 40% or less. The acoustic resonator in the example embodiment may include two piezoelectric layers, a first piezoelectric layer 131a and a second piezoelectric layer 131b. A ratio between the average thicknesses of the first piezoelectric layer 131a and the second piezoelectric layer 131b may be adjusted to be within the above range, such that excellent Q performance may be implemented.

In the example embodiment, the acoustic resonator in the example embodiment may include the substrate 110, a sacrificial layer 140, a membrane layer 150, and the resonant portion 120.

The substrate 110 may be configured as a silicon substrate. For example, a silicon wafer or a silicon on insulator (SOI) type substrate may be used as the substrate 110. An insulating layer 115 may be provided on the upper surface of the substrate 110 to electrically isolate the substrate 110 from the resonant portion 120. Also, the insulating layer 115 may prevent the substrate 110 from being etched by an etching gas when a cavity C is formed in the process of manufacturing an acoustic resonator. In this case, the insulating layer 115 may be formed of at least one of silicon dioxide ($SiO_2$), silicon nitride ($Si_3N_4$), aluminum oxide ($Al_2O_3$), and aluminum nitride (AlN), and may be formed on the substrate 110 by one of chemical vapor deposition, RF magnetron sputtering, and evaporation.

The sacrificial layer 140 may be formed on the insulating layer 115, and the cavity C and an etch stop portion 145 may be disposed in the sacrificial layer 140. The cavity C may be formed as a void and may be formed by removing a portion of the sacrificial layer 140. As the cavity C is formed in the sacrificial layer 140, the resonant portion 120 disposed on the sacrificial layer 140 may be formed to be entirely flat. The etch stop portion 145 may be disposed along the boundary of the cavity C. The etch stop portion 145 may prevent etching beyond the cavity region during the process of forming the cavity C. Accordingly, the horizontal area of the cavity C may be defined by the etch stop portion 145, and the vertical area may be defined by the thickness of the sacrificial layer 140.

The membrane layer 150 may be formed on the sacrificial layer 140 and may define the thickness (or height) of the cavity C together with the substrate 110. Therefore, the membrane layer 150 may also be formed of a material not easily removed in the process of forming the cavity C. For example, when a halide-based etching gas such as fluorine (F) or chlorine (Cl) is used to remove a portion (e.g., the cavity region) of the sacrificial layer 140, the membrane layer 150 may be formed of a material having low reactivity with the etching gas mentioned above. In this case, the membrane layer 150 may include at least one of silicon dioxide ($SiO_2$) and silicon nitride ($Si_3N_4$). Also, the membrane layer 150 may be configured as a dielectric layer including at least one of oxide (MgO), zirconium oxide ($ZrO_2$), aluminum nitride (AlN), lead zirconium titanate (PZT), gallium arsenide (GaAs), hafnium oxide ($HfO_2$), and aluminum oxide ($Al_2O_3$), titanium oxide ($TiO_2$), and zinc oxide (ZnO), or may be configured as a metal layer including at least one of aluminum (Al), nickel (Ni), chromium (Cr), platinum (Pt), gallium (Ga), and hafnium (Hf). However, an example embodiment thereof is not limited thereto.

A seed layer (not illustrated) formed of aluminum nitride (AlN) may be formed on the membrane layer 150. Specifically, the seed layer may be disposed between the membrane layer 150 and the first electrode 121. The seed layer may be formed using a dielectric material having an HCP structure or a metal other than AlN. For example, when a metal is used, the seed layer may be formed of titanium (Ti).

The resonant portion 120 may include the central portion S, including the first electrode 121, the first piezoelectric layer 131*a*, the second piezoelectric layer 131*b*, and the second electrode 125. The extension portion E extends outwardly from the central portion S and includes the insertion layer 170. In the resonant portion 120, the first electrode 121, the first piezoelectric layer 131*a*, the second piezoelectric layer 131*b*, and the second electrode 125 may be stacked in order from a lower portion. Accordingly, in the resonant portion 120, the first piezoelectric layer 131*a* and the second piezoelectric layer 131*b* may be disposed between the first electrode 121 and the second electrode 125.

Since the resonant portion 120 is formed on the membrane layer 150, the membrane layer 150, the first electrode 121, the first piezoelectric layer 131*a*, the second piezoelectric layer 131*b*, and the second electrode 125 may be stacked in order and may form the resonant portion 120. The resonant portion 120 may allow the first piezoelectric layer 131*a* and the second piezoelectric layer 131*b* to resonate in response to a signal applied to the first electrode 121 and the second electrode 125, thereby generating a resonant frequency and an antiresonant frequency. When the insertion layer 170 is formed, the resonant portion 120 may be divided into the central portion S in which the first electrode 121, the first piezoelectric layer 131*a*, the second piezoelectric layer 131*b*, and the second electrode 125 are stacked to be flat, and the extension portion E in which the insertion layer 170 is disposed.

The central portion S may refer to a region disposed in the center of the resonant portion 120, and the extension portion E may refer to a region disposed along the periphery of the central portion S. Accordingly, the extension portion E may refer to an area extending outwardly from the central portion S.

In the example embodiment, the extension portion E may be included in the resonant portion 120, and accordingly, resonance may occur in the extension portion E as well. However, an example embodiment thereof is not limited thereto, and resonance may not occur in the extension portion E and may occur only in the central portion S depending on the structure of the extension portion E.

The first electrode 121 and the second electrode 125 may be formed of a conductor, such as, for example, gold, molybdenum, ruthenium, iridium, aluminum, platinum, titanium, tungsten, palladium, tantalum, chromium, nickel, or a metal including at least one of the above-mentioned elements, but an example embodiment thereof is not limited thereto. In the resonant portion 120, the first electrode 121 may have an area larger than that of the second electrode 125, and a first metal layer 180 may be formed on the first electrode 121 along the periphery of the first electrode 121. Accordingly, the first metal layer 180 may surround the second electrode 125.

Since the first electrode 121 is disposed on the membrane layer 150, the first electrode 121 may be formed to be entirely flat. Also, since the second electrode 125 is disposed on the second piezoelectric layer 131*b*, a bent portion may be formed to correspond to the shape of the second piezoelectric layer 131*b*. The second electrode 125 may be entirely disposed in the central portion S, and may be partially disposed in the extension portion E. Accordingly, the second electrode 125 may be divided into a portion disposed on a piezoelectric portion 131 of the second piezoelectric layer 131*b*, and a portion disposed on the a bent portion 132 of the second piezoelectric layer 131*b*. More specifically, in the example embodiment, the second electrode 125 may be disposed to cover the entire piezoelectric portion 131 of the second piezoelectric layer 131*b* and a portion of an inclined portion 132*a* of the bent portion 132 of the second piezoelectric layer 131*b*. Accordingly, a portion of second electrode 125 disposed in the extension portion E may have an area smaller than that of the inclined surface of the inclined portion, so the second electrode 125 in the resonant portion 120 may have an area smaller than that of the second piezoelectric layer 131*b*.

In the example embodiment, the resonant portion of the acoustic resonator in the example embodiment may include the first piezoelectric layer 131*a* and the second piezoelectric layer 131*b*. The first piezoelectric layer 131*a* may be formed on the first electrode 121, and the second piezoelectric layer 131*b* may be formed on the first piezoelectric layer 131*a*. As for a material of the first and second piezoelectric layers 131*b*, zinc oxide (ZnO), aluminum nitride (AlN), doped aluminum nitride, lead zirconate titanate, quartz, and the like may be used selectively. The doped aluminum nitride may further include a rare earth metal, a transition metal, or an alkaline earth metal. For example, a rare earth metal may include at least one of scandium (Sc), erbium (Er), yttrium (Y), and lanthanum (La), and the content of a rare earth metal may be 1 to 20 at %. A transition metal may include at least one of hafnium (Hf), titanium (Ti), zirconium (Zr), tantalum (Ta), and niobium (Nb). An alkaline earth metal may include magnesium (Mg).

In an example, a piezoelectric coefficient of the first piezoelectric layer 131a may be different from a piezoelectric coefficient of the second piezoelectric layer 131b of the acoustic resonator in the example embodiment. A general acoustic resonator may use a method of adjusting the thickness of the piezoelectric layer to implement a desired $kt^2$ (electromechanical coupling coefficient) value, but in a single piezoelectric layer, the derived $kt^2$ implementation area may be limited depending on a material. Also, even if a single piezoelectric layer is doped with a material able to control the piezoelectric coefficient, the $kt^2$ implementation region may only be controlled in a limited manner, and costs may increase. The acoustic resonator in the example embodiment may implement various $kt^2$ areas using the first piezoelectric layer 131a and the second piezoelectric layer 131b having different piezoelectric coefficients.

A method of configuring the first piezoelectric layer 131a and the second piezoelectric layer 131b to have different piezoelectric coefficients is not limited to any particular method, and for example, the method of forming the first piezoelectric layer 131a and the second piezoelectric layer 131b using different components, adjusting the content of components doped into the first piezoelectric layer 131a and the second piezoelectric layer 131b, or adjusting the thicknesses of the first piezoelectric layer 131a and the second piezoelectric layer 131b may be used, but an example embodiment thereof is not limited thereto.

In the example embodiment, a root mean square (RMS) of a roughness of the interfacial surface between the first piezoelectric layer 131a and the second piezoelectric layer 131b of the acoustic resonator in the example embodiment may be 2 nm or less. The root mean square may be a value measured at a cross-sectional surface crossing the center of the acoustic resonator as illustrated in FIG. 2, and specifically, the root mean square may be arithmetic average of the values measured at 10 points with an equal distance on the interfacial surface in the central portion S of the first piezoelectric layer 131a and the second piezoelectric layer 131b on the cross-sectional surface. Generally, to increase a contact area of the interfacial surface between two surfaces in contact with each other, a method of increasing the roughness of the interfacial surface may be used. In the example embodiment, when the roughness of the interfacial surface between the first piezoelectric layer 131a and the second piezoelectric layer 131b of the acoustic resonator is reduced, the surface area in which the first piezoelectric layer 131a and the second piezoelectric layer 131b contact with each other may be reduced, but the interfacial surface loss between the first piezoelectric layer 131a and the second piezoelectric layer 131b may rather decrease. When the root mean square of the interfacial surface between the first piezoelectric layer 131a and the second piezoelectric layer 131b of the acoustic resonator in the example embodiment is 2 nm or less, the Q performance may not be deteriorated as compared to the example in which a single piezoelectric layer is used, and the $kt^2$ implementation area may be easily controlled.

In an example, the first piezoelectric layer 131a and the second piezoelectric layer 131b of the acoustic resonator in the example embodiment may include a piezoelectric portion 131 disposed in the central portion S, and a bent portion 132 disposed in the extension portion E. The piezoelectric portion 130 and the bent portion 132 form a piezoelectric layer 130. The piezoelectric portion 131 may be directly stacked on the upper surface of the first electrode 121. Accordingly, the piezoelectric portion 131 may be interposed between the first electrode 121 and the second electrode 125 and may be formed to be flat together with the first electrode 121 and the second electrode 125.

The bent portion 132 may be defined as a region extending outwardly from the piezoelectric portion 131 and disposed within the extension portion E. The bent portion 132 may be disposed on the insertion layer 170, and may be raised along the shape of the insertion layer 170. Accordingly, the first piezoelectric layer 131a and/or the second piezoelectric layer 131b may be bent on the boundary between the piezoelectric portion 131 and the bent portion 132, and the bent portion 132 may be raised to correspond to the thickness and shape of the insertion layer 170. In this example, the structure in which the insertion layer 170 is disposed below the first piezoelectric layer 131a and the second piezoelectric layer 131b is described, but when the insertion layer 170 is disposed on the second electrode, the bent portion 132 may not be formed.

The bent portion 132 may be divided into an inclined portion 132a and an extension portion 132b. The inclined portion 132a may refer to a portion inclined along an inclined surface L of the insertion layer 170. Also, the extension portion 132b may refer to a portion extending outwardly from the inclined portion 132a. The inclined portion 132a may be formed parallel to the inclined surface L of the insertion layer 170, and the inclination angle of the inclined portion 132a may be the same as the inclination angle θ FIGS. 6 to 9) of the inclined surface L of the insertion layer 170 and may be formed in the same way.

In the example embodiment, the extension portion E of the acoustic resonator in the example embodiment may include the insertion layer 170. The insertion layer 170 may have the inclined surface L of which the thickness may increase in a direction of being further away from the central portion S. In the extension portion E, the first piezoelectric layer 131a and/or the second piezoelectric layer 131b and the second electrode 125 may be disposed on the insertion layer 170. Accordingly, the first piezoelectric layer 131a and/or the second piezoelectric layer 131b and the second electrode 125 disposed in the extension portion E may have an inclined surface along the shape of the insertion layer 170.

The insertion layer 170 may be disposed around the central portion S and may support the bent portion 132 of the first piezoelectric layer 131a and/or the second piezoelectric layer 131b. Accordingly, the bent portion 132 of the first piezoelectric layer 131a and/or the second piezoelectric layer 131b may be divided into the inclined portion 132a and the extension portion 132b depending on the shape of the insertion layer 170. The side surface of the insertion layer 170 disposed along the boundary of the central portion S may have a thickness increasing in the direction of being further away from the central portion S. Accordingly, the side surface of the insertion layer 170 disposed adjacent to the central portion S may be configured as the inclined surface L having a predetermined inclination angle θ.

When the inclination angle θ of the side surface of the insertion layer 170 is smaller than 5°, the thickness of the insert insertion layer 170 may need to be reduced, or the area of the inclined surface L may need to be increased excessively to form the inclination angle, and thus it may be difficult to implement the configuration. Also, when the inclination angle θ of the side surface of the insertion layer 170 is greater than 70°, the inclination angle of the inclined portion 132a of the first piezoelectric layer 131a and/or the second piezoelectric layer 131b stacked on the insertion layer 170 may be greater than 70°. In this case, the first piezoelectric layer 131a and/or the second piezoelectric layer 131b may be excessively bent, such that cracks may occur in the bent portion 132 of the first piezoelectric layer 131a and/or the second piezoelectric layer 131b. Accordingly, in the example embodiment, the inclination angle θ of the inclined surface L may be formed in the range of 5° or more and 70° or less.

In the example embodiment, the insertion layer 170 of the acoustic resonator in the example embodiment may be formed of a material different from that of the first piezoelectric layer 131a and the second piezoelectric layer 131b. The configuration in which the insertion layer 170 may be formed of a material different from that of the first piezoelectric layer 131a and the second piezoelectric layer 131b may indicate that the insertion layer 170 may include a component different from those of the first piezoelectric layer 131a and the second piezoelectric layer 131b or may include a content ratio different from content ratios of the components of the first piezoelectric layer 131a and the second piezoelectric layer 131b.

In the example embodiment, the insertion layer 170 of the acoustic resonator in the example embodiment may include one or more dielectrics selected from a group consisting of silicon oxide ($SiO_2$), aluminum nitride (AlN), aluminum oxide ($Al_2O_3$), silicon nitride (SiN), manganese oxide (MgO), zirconium oxide ($ZrO_2$), zirconium lead titanate (PZT), gallium arsenide (GaAs), hafnium oxide ($HfO_2$), titanium oxide ($TiO_2$), and zinc oxide (ZnO). The dielectrics may be, for example, a component different from that of the first piezoelectric layer 131a and the second piezoelectric layer 131b. Also, if desired, the region in which the insertion layer 170 is disposed may be formed as air, which may be implemented by forming the entire resonant portion 120 and removing the insertion layer 170 in the manufacturing process.

In the example embodiment, the thickness of the insertion layer 170 may be the same as or similar to the thickness of the first electrode 121, or may be similar to that of the first piezoelectric layer 131a and/or the second piezoelectric layer 131b or may be less than that of the first piezoelectric layer 131a and/or the second piezoelectric layer 131b. For example, the insertion layer 170 may have a thickness of 100 Å or more, and the thickness may be less than the thickness of the first piezoelectric layer 131a and/or the second piezoelectric layer 131b. However, an example embodiment thereof is not limited thereto.

Figure 6:
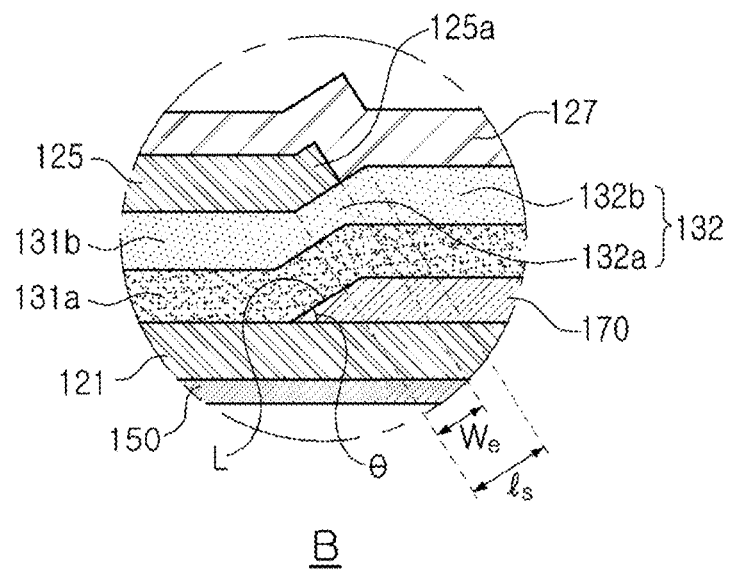
FIGS. 6 to 9 are enlarged diagrams illustrating region B in FIG. 5.

In an example, the insertion layer 170 of the acoustic resonator in the example embodiment may be disposed along the surface formed by the membrane layer 150, the first electrode 121, and the etch stop portion 145. In this case, the insertion layer 170 may be disposed between the first electrode and the first piezoelectric layer 131a, and the insertion layer 170 may be disposed in a region other than the central portion S. FIG. 6 is an enlarged diagram illustrating region B of the acoustic resonator according to an example embodiment. Referring to FIG. 6, the insertion layer 170 may be disposed on the first electrode. The first piezoelectric layer 131a and the second piezoelectric layer 131b may be raised according to the thickness and shape of the insertion layer 170.

In the example embodiment, since the inclined portions 132a of the first piezoelectric layer 131 and the second piezoelectric layer 131b may be formed in the same shape along the inclined surface of the insertion layer 170, a length of the inclined portions 132a of the first piezoelectric layer 131 and the second piezoelectric layer 131b may be considered to be equal to a length $l_c$ of the inclined surface L of the insertion layer 170. Also, a length $W_e$ of an inclined portion 125b of the second electrode 125 may be less than the length $l_c$ of the inclined surface L of the insertion layer 170.

Figure 7:
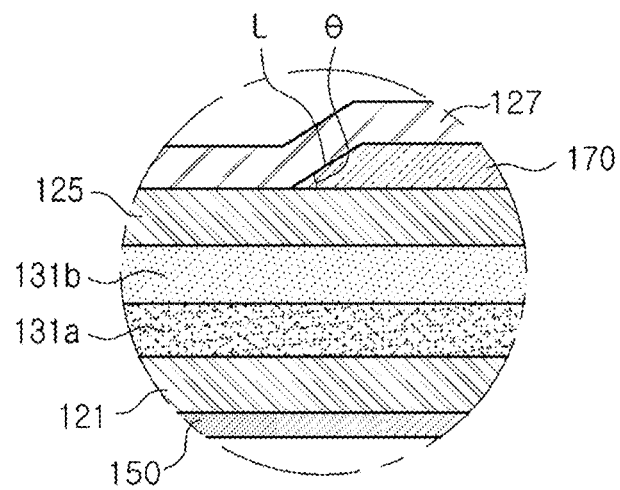

In another example, the insertion layer 170 of the acoustic resonator in the example embodiment may be disposed on the second electrode 125. FIG. 7 is an enlarged diagram illustrating region B of the acoustic resonator according to an example embodiment. Referring to FIG. 7, the insertion layer 170 may be disposed on the second electrode 125, and may be disposed between the second electrode and a protective layer 127. In this case, an inclined surface formed by the insertion layer 170 may be formed only on the protective layer 127, so the inclined portion 132a may not be formed on the first piezoelectric layer 131a and the second piezoelectric layer 131b as shown in FIG. 6.

Figure 8:
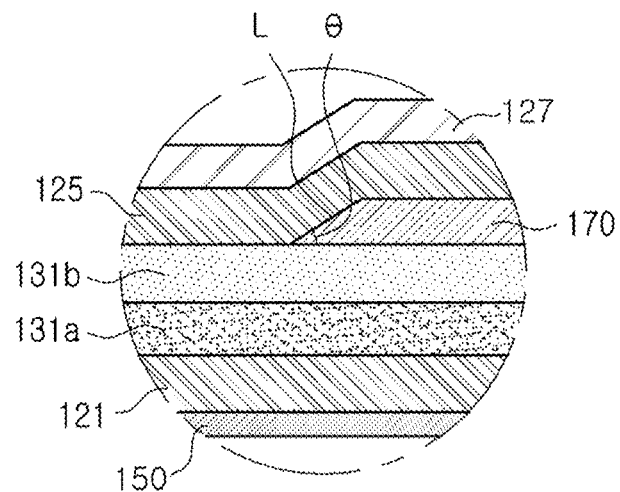

In another example, the insertion layer 170 of the acoustic resonator in the example embodiment may be disposed on the second piezoelectric layer 131b. In this example, the insertion layer 170 may be disposed between the second piezoelectric layer 131b and the second electrode 125. In this case, an inclined surface formed by the insertion layer 170 may be formed only on the second electrode and the protective layer 127, the inclined portion 132a may not be formed on the first piezoelectric layer 131a and the second piezoelectric layer 131b as shown in FIG. 6. FIG. 8 is an enlarged diagram illustrating region B of the acoustic resonator according to an example embodiment. Referring to FIG. 8, the insertion layer 170 may be disposed between the second piezoelectric layer 131b and the second electrode 125, and the second electrode 125 and the protective layer 127 may be raised depending on the thickness and shape of the insertion layer 170.

Figure 9:
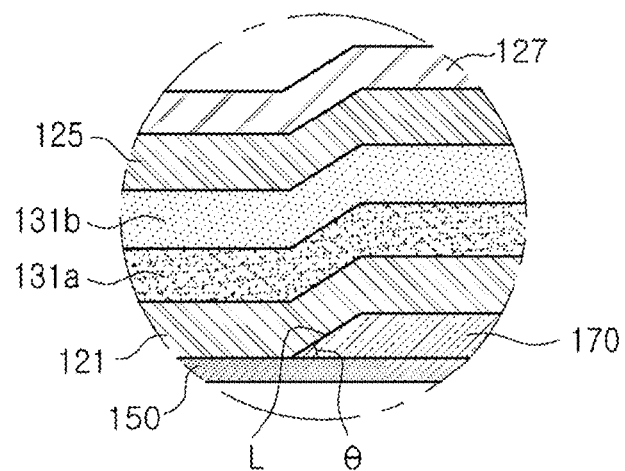

In another example, the insertion layer 170 of the acoustic resonator in the example embodiment may be disposed below the first electrode 121. FIG. 9 is an enlarged diagram illustrating region B of the acoustic resonator according to an example embodiment. Referring to FIG. 9, the insertion layer 170 may be disposed below the first electrode 121, and may be disposed between the first electrode 121 and the membrane layer 150. In this case, the first piezoelectric layer 131a and the second piezoelectric layer 131b may include an inclined portion 132a due to the insertion layer 170, and the first piezoelectric layer 131a and the second piezoelectric layer 131b may be raised depending on the thickness and shape of the insertion layer 170.

The resonant portion 120 configured as above in the example embodiment may be spaced apart from the substrate 110 through the cavity C formed as air. The cavity C may be formed by supplying an etching gas (or an etching solution) to the inlet hole H (in FIGS. 1 and 3) and removing a portion of the sacrificial layer 140 in the process of manufacturing of the acoustic resonator.

The protective layer 127 may be disposed along the surface of the acoustic resonator 100 and may protect the acoustic resonator 100 from the outside. The protective layer 127 may be disposed along the surface formed by the second electrode 125, the bent portion 132 of the piezoelectric layer 130, and the insertion layer 170. The protective layer 127 may be formed of an insulating material selected from among a silicon oxide-based insulating material, a silicon nitride-based insulating material, an aluminum oxide-based insulating material, and an aluminum nitride-based insulating material, but an example embodiment thereof is not limited thereto.

The first electrode 121 and the second electrode 125 may be configured to extend to an external side of the resonant portion 120, and the first metal layer 180 and the second metal layer 190 may be disposed on the upper surfaces of the extension portions, respectively. The first metal layer 180 and the second metal layer 190 may be formed of a material such as gold (Au), a gold-tin (Au—Sn) alloy, copper (Cu), a copper-tin (Cu—Sn) alloy, aluminum (Al), or an aluminum-germanium (Al—Ge) alloy. The first metal layer 180 and the second metal layer 190 may function as connection wires for electrically connecting electrodes of the other acoustic resonator disposed adjacent to the electrodes 121 and 125 of the acoustic resonator in the example embodiment, or may function as a connection terminal. However, an example embodiment thereof is not limited thereto.

The first metal layer 180 may penetrate the insertion layer 170 and the passivation layer 127 and may be bonded to the first electrode 121. Also, as illustrated in FIG. 2, the first electrode 121 may have an area larger than that of the second electrode 125, and the first metal layer 180 may be formed on the periphery of the first electrode 121. Accordingly, the first metal layer 180 may be disposed along the periphery of the resonant portion 120 and may surround the second electrode 125, but an example embodiment thereof is not limited thereto.

As described above, the second electrode 125 in the example embodiment may be stacked on the piezoelectric portion and the inclined portion 132a of the second piezoelectric layer 131b. Also, a portion of the second electrode 125 disposed on the inclined portion 132a of the second piezoelectric layer 131b, that is, the second electrode 125 disposed on the extension portion E, may be disposed only in a portion of the inclined portion 132a, rather than being disposed on the entire inclined surface of the inclined portion 132a.

Figure 10A:
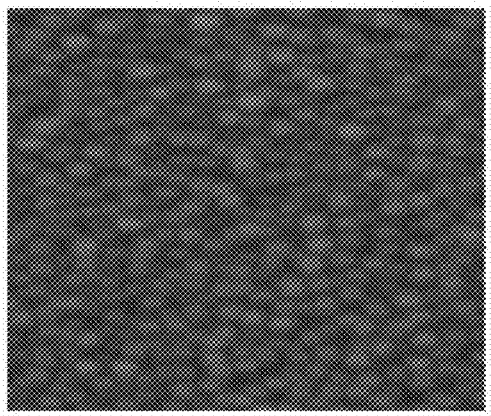
FIG. 10A is an SEM image of the surface of a piezoelectric layer of an acoustic resonator according to the prior art.
Figure 10B:
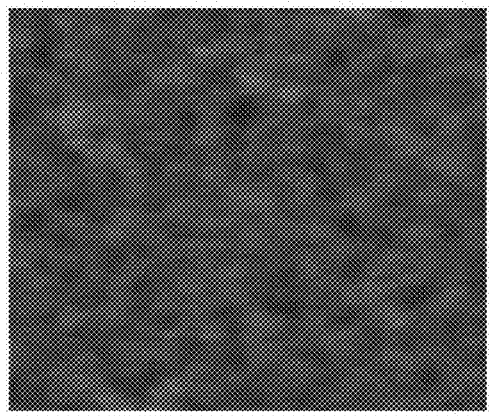
FIG. 10B is an SEM image of the surface of a first piezoelectric layer according to an example embodiment of the present disclosure.

FIG. 10A is an SEM image of the surface of a piezoelectric layer of an acoustic resonator according to the prior art. FIG. 10B is an SEM image of the surface of a first piezoelectric layer according to an example embodiment. In FIG. 10A, the surface roughness of the piezoelectric layer was measured to be in the range of about 3 to 5 nm, and in FIG. 10B, the surface roughness of the piezoelectric layer was measured to be about 2 nm. According to the SEM images in FIGS. 10A and 10B and the results of surface roughness measurement, it is indicated that the fine surface roughness of the surface of the piezoelectric layer may be adjusted to a desired range through surface treatment of the piezoelectric layer.

Figure 11A:
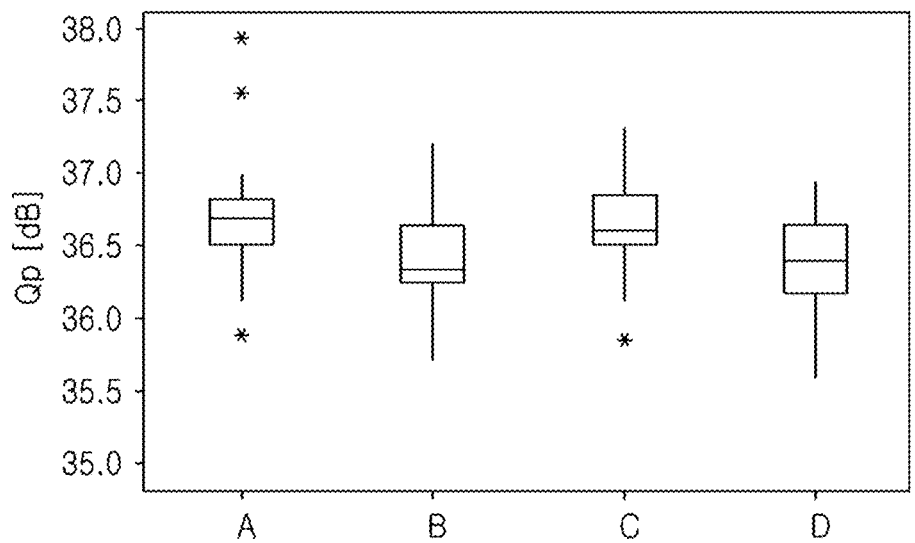
FIGS. 11A and 11B are graphs illustrating Qp values and $KT^2$ values of an acoustic resonator according to a comparative example and an embodiment of the present disclosure.
Figure 11B:
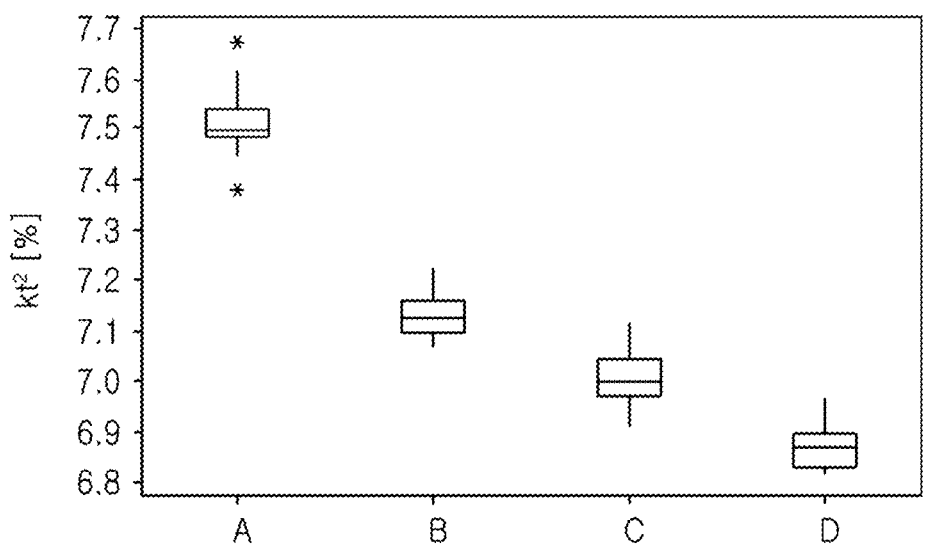

FIG. 11A is a graph illustrating Qp values of a piezoelectric resonator according to a comparative example and an embodiment, and FIG. 11B is a graph illustrating $kt^2$ values of a piezoelectric resonator according to a comparative example and an embodiment. In FIGS. 11A and 11B, "A" on the horizontal axis may be a comparative example illustrating the prior art in which the piezoelectric layer was configured as a single layer, "B" may be the example in which the ratio (t1/t2) of the average thickness t1 of the first piezoelectric layer to the average thickness t2 of the second piezoelectric layer was 18.4%, "C" may be the example in which the ratio (t1/t2) was 28.3%, and D-"D" may be the example in which the ratio (t1/t2) was 40%. Referring to FIG. 11A, there was no difference between the Qp values of the piezoelectric resonator in the example embodiment in which the ratio (t1/t2) of the average thickness t1 of the first piezoelectric layer to the average thickness t2 of the second piezoelectric layer was 18.4% (B), 28.3% (C) and 40% (D), and the Qp values in the comparative example (A) in which a single piezoelectric layer was used. Accordingly, it was confirmed that almost no interfacial loss occurred in the piezoelectric resonator in the example embodiment. Also, referring to FIG. 11B, it was confirmed that the piezoelectric resonator in the embodiment in which the ratio (t1/t2) of the average thickness t1 of the first piezoelectric layer to the average thickness t2 of the second piezoelectric layer was 18.4% (B), 28.3% (C) and 40% (D) may have no different Qp values than those of the comparative example (A), and may implement the $kt^2$ area having various values in a relatively wide range.

Figure 12:
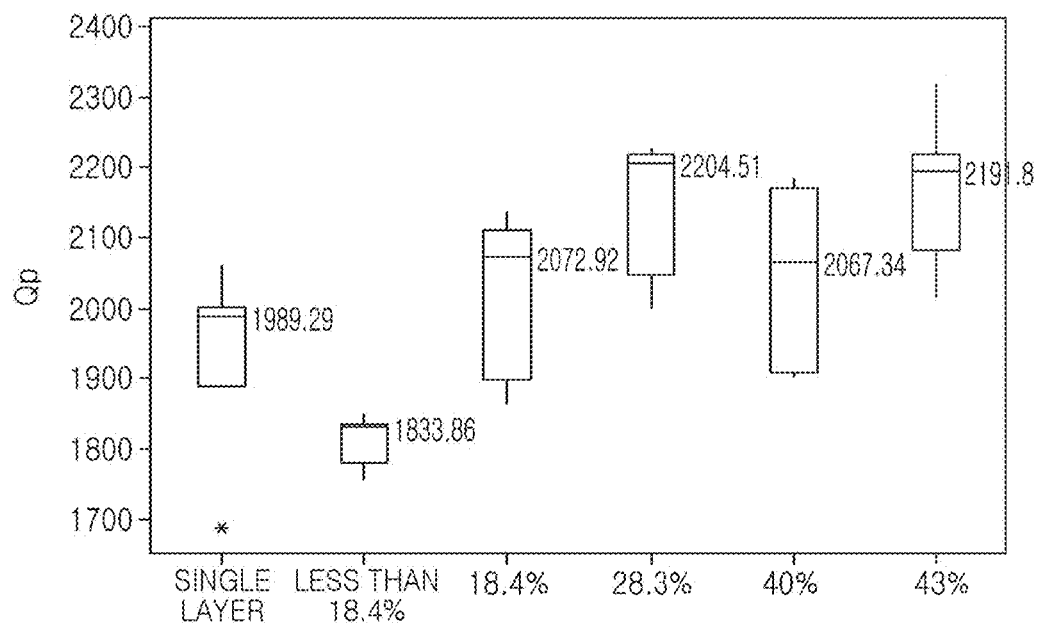
FIG. 12 is a graph illustrating Qp values of an acoustic resonator according to a comparative example and an example embodiment of the present disclosure.

FIG. 12 is a graph illustrating Qp values of an acoustic resonator according to a comparative example and an example embodiment. Referring to FIG. 12, it was confirmed that when the ratio (t1/t2) of the average thickness t1 of the first piezoelectric layer to the average thickness t2 of the second piezoelectric layer was 18.4%, 28.3%, and 40%, the Qp values were similar to those of the piezoelectric resonator using a piezoelectric layer in the comparative example, whereas, when the ratio (t1/t2) was less than 18.4%, the Qp value decreased rapidly, which may be caused by deterioration of crystallinity of the first piezoelectric layer when the ratio (t1/t2) was less than 18.4%. Thus, it is indicated that, when the ratio (t1/t2) was 18.4% or more, a piezoelectric resonator having the Qp value with desired performance may be implemented.

Figure 13:
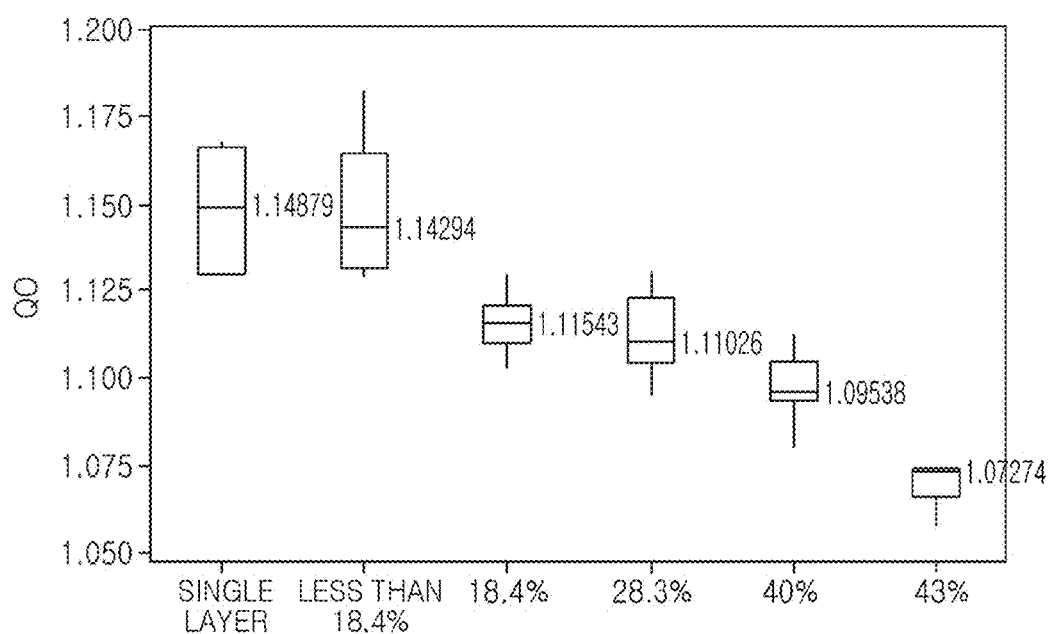
FIG. 13 is a graph illustrating QO values of an acoustic resonator according to a comparative example and an example embodiment of the present disclosure.

FIG. 13 is a graph illustrating QO values of an acoustic resonator according to a comparative example and an example embodiment. Referring to FIG. 13, it was confirmed that, as compared to the example in which the ratio (t1/t2) of the average thickness t1 of the first piezoelectric layer to the average thickness t2 of the second piezoelectric layer was 18.4%, 28.3%, and 40%, when the ratio (t1/t2) exceeded 40%, the QO properties rapidly deteriorated. In this case, it may be difficult to implement a component having the designed configuration, and the overall topology may need to be changed by redesigning. That is, it may be confirmed that, when the ratio (t1/t2) was 40% or less, the piezoelectric resonator in the example embodiment exhibited the performance as intended.

According to the aforementioned example embodiments, the interfacial loss of the acoustic resonator may be reduced.

Also, the Q performance of the acoustic resonator may improve.

Further, an acoustic resonator which may implement flexibility in designing various $kt^2$ areas may be provided.

Also, an acoustic resonator configured with low costs and high-efficiency may be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
   a substrate; and
   a resonant portion comprising a central portion in which a first electrode, a first piezoelectric layer, a second piezoelectric layer, and a second electrode are stacked in the order listed herein on the substrate, and an extension portion extending outwardly from the central portion and comprising an insertion layer,
   wherein a ratio of an average thickness of the first piezoelectric layer to an average thickness of the second piezoelectric layer is 18.4% to 40%, and
   the insertion layer is disposed above the second electrode, or is disposed between the second piezoelectric layer and the second electrode, or is disposed below the first electrode.

2. The acoustic resonator of claim 1, wherein a piezoelectric coefficient of the first piezoelectric layer is different from a piezoelectric coefficient of the second piezoelectric layer.

3. The acoustic resonator of claim 1, wherein a root mean square (RMS) of a roughness of an interfacial surface between the first piezoelectric layer and the second piezoelectric layer is 2 nm or less.

4. The acoustic resonator of claim 1, wherein the insertion layer has an inclined surface extending away from the central portion.

5. The acoustic resonator of claim 1, wherein the extension portion further comprises a portion of the second electrode.

6. The acoustic resonator of claim 1, wherein the extension portion further comprises a bent portion extending obliquely from the central portion along a shape of the insertion layer,
   wherein the bent portion comprises an inclined portion disposed on an inclined surface of the insertion layer.

7. The acoustic resonator of claim 1, wherein the insertion layer is made of a material different from a material of the first and second piezoelectric layers.

8. The acoustic resonator of claim 1, wherein the insertion layer comprises a dielectric material.

9. An acoustic resonator comprising:
   a substrate; and
   a resonant portion comprising a central portion in which a first electrode, a first piezoelectric layer, a second piezoelectric layer, and a second electrode are stacked in the order listed herein on the substrate, and an extension portion extending outwardly from the central portion and comprising an insertion layer,
   wherein a piezoelectric coefficient of the first piezoelectric layer is different from a piezoelectric coefficient of the second piezoelectric layer,
   a root mean square (RMS) of a roughness of an interfacial surface between the first piezoelectric layer and the second piezoelectric layer is 2 nm or less, and
   the insertion layer is disposed above the second electrode, or is disposed between the second piezoelectric layer and the second electrode, or is disposed below the first electrode.

10. The acoustic resonator of claim 9, wherein a ratio of an average thickness of the first piezoelectric layer to an average thickness of the second piezoelectric layer is 18.4% to 40%.

* * * * *